US012648245B2

(12) United States Patent
Steckel et al.

(10) Patent No.: US 12,648,245 B2
(45) Date of Patent: Jun. 2, 2026

(54) IMAGING DEVICE INCLUDING A SEMICONDUCTOR NANOPARTICLE PHOTOSENSITIVE LAYER AND ULTRAVIOLET/INFRARED FILTERING

(71) Applicants:STMicroelectronics (Grenoble 2) SAS, Grenoble (FR); STMicroelectronics (Crolles 2) SAS, Crolles (FR); STMicroelectronics (Alps) SAS, Grenoble (FR)

(72) Inventors: Jonathan Steckel, Corenc (FR); Emmanuel Josse, La Motte Servolex (FR); Eric Mazaleyrat, Meaudre (FR); Youness Radid, Grenoble (FR)

(73) Assignees: STMicroelectronics (Grenoble 2) SAS, Grenoble (FR); STMicroelectronics (Crolles 2) SAS, Crolles (FR); STMicroelectronics (Alps) SAS, Grenoble (FR)

( * ) Notice: Subject to any disclaimer, the term of this patent is extended or adjusted under 35 U.S.C. 154(b) by 470 days.

(21) Appl. No.: 18/129,993

(22) Filed: Apr. 3, 2023

(65) Prior Publication Data

US 2023/0317748 A1    Oct. 5, 2023

(30) Foreign Application Priority Data

Apr. 4, 2022    (FR) ...................................... 2203036

(51) Int. Cl.
*H10F 39/00*         (2025.01)
(52) U.S. Cl.
CPC ..... *H10F 39/8053* (2025.01); *H10F 39/8037* (2025.01); *H10F 39/8063* (2025.01); *H10F 39/811* (2025.01)

(58) Field of Classification Search
CPC ............. H10F 39/8037; H10F 39/8053; H10F 39/8063; H10F 39/811
See application file for complete search history.

(56) References Cited

U.S. PATENT DOCUMENTS 9,117,722 B1    8/2015    Koenck et al.
2007/0284687 A1* 12/2007    Rantala ............. H01L 21/02282
                                              257/E31.128

(Continued)

FOREIGN PATENT DOCUMENTS

| | | | | |
|---|---|---|---|---|
| CN | 112385049 A | * | 2/2021 | ........ H10F 77/1625 |
| WO | WO-2006079959 A2 | * | 8/2006 | ............ G02F 1/167 |
| WO | 2021023655 A1 | | 2/2021 | |

OTHER PUBLICATIONS

INPI Search Report and Written Opinion for priority application, FR 2203036, report dated Feb. 14, 2023, 8 pgs.

*Primary Examiner* — Matthew E Warren
(74) *Attorney, Agent, or Firm* — Crowe & Dunlevy LLC

(57)         ABSTRACT

An imaging device includes an array of photosensors. A film of semiconductor nanoparticles is common to the photosensors of the array. The nanoparticles are configured to be excited by light with wavelengths in a range from 280 to 1500 nanometers. Each photosensor includes a top electrode and a bottom electrode positioned on opposite sides of the film of semiconductor nanoparticles. At least some of the photosensors further include a filter configured to transmit light with wavelengths in a range from 280 to 400 nanometers, and to at least partially filter out light with wavelengths greater than 400 nanometers from reaching the photosensor. A transistor level is electrically coupled to the top and bottom electrodes of the photosensors.

20 Claims, 5 Drawing Sheets

(56)  References Cited

U.S. PATENT DOCUMENTS

| | | | |
|---|---|---|---|
| 2020/0312913 A1* | 10/2020 | Yajima | .................. H10K 65/00 |
| 2021/0074744 A1* | 3/2021 | Sumida | ................. H04N 25/76 |

* cited by examiner

| PROVIDING A TRANSISTOR LEVEL | 302 |

| PROVIDING BOTTOM ELECTRODES COUPLED TO TRANSISTOR LEVEL | 304 |

| FORMING A FILM SEMICONDUCTOR NANOPARTICLES | 306 |

| FORMING TOP ELECTRODES ON OPPOSITE SIDES OF THE FILM AND COUPLED TO TRANSISTOR LEVEL | 308 |

| FORMING A FILTER | 310 |

IMAGING DEVICE INCLUDING A SEMICONDUCTOR NANOPARTICLE PHOTOSENSITIVE LAYER AND ULTRAVIOLET/INFRARED FILTERING

PRIORITY CLAIM

This application claims the priority benefit of French Application for Patent No. 2203036, filed on Apr. 4, 2022, the content of which is hereby incorporated by reference in its entirety to the maximum extent allowable by law.

TECHNICAL FIELD

The present disclosure relates generally to imaging devices and related manufacturing methods.

BACKGROUND

Ultra Violet (UV) and Infrared (IR) light sensing can reveal details that are hidden when sensing in the visible light range. Nevertheless, existing imaging devices, especially UV and/or IR sensing devices based on bulk semiconductor technologies, generally suffer from drawbacks such as high manufacturing cost, high pixel area and/or relatively low resolution.

There is a need to provide an imaging device able to sense UV, and optionally IR, which at least partially overcomes drawbacks in the prior art, and which for example exhibits improved resolution and/or reduced surface area, and is compatible with mass production in order, for example, to be capable of integration mobile telephones such as smartphones.

SUMMARY

One embodiment addresses all or some of the drawbacks of known imaging device.

One embodiment provides an imaging device comprising: an array of photosensors, the array comprising a film of semiconductor nanoparticles common to the photosensors of the array, the nanoparticles configured to be excited by light with wavelengths in a range from 280 to 1500 nanometers, wherein: each photosensor comprises a top electrode and a bottom electrode positioned on opposite sides of the film of semiconductor nanoparticles; and at least some of the photosensors comprise a first filter configured to transmit light with wavelengths in a range from 280 to 400 nanometers, and to at least partially filter out, and at least partially prevent from reaching the photosensor, light with wavelengths greater than 400 nanometers; and a transistor level coupled to the top and bottom electrodes of the photosensors.

One embodiment provides a method of manufacturing an imaging device, the method comprising: providing a transistor level of an imaging device; providing bottom electrodes of photosensors of an array; forming a film of semiconductor nanoparticles common to the photosensors of the array, the nanoparticles configured to be excited by light with wavelengths in a range from 280 to 1500 nanometers; forming top electrodes of the photosensors, the top and bottom electrodes being positioned on opposite sides of the film of semiconductor nanoparticles; the transistor level being coupled to the bottom and top electrodes of the photosensors; forming a first filter over at least some of the photosensors and configured to transmit light with wavelengths in a range from 280 to 400 nanometers, and to at least partially filter out, and at least partially prevent from reaching the photosensor, light with wavelengths greater than 400 nanometers.

According to one embodiment, the photosensors are arranged in the array in columns and rows with a pitch of 2 micrometers or less in a direction of the columns and/or in a direction of the rows.

According to one embodiment, at least some others of the photosensors comprise a second filter configured to transmit light in a range from 900 to 1500 nanometers and to at least partially filter out, and prevent from reaching the photosensor, light with wavelengths lower than 900 nanometers.

According to one embodiment, the top electrode of each photosensor comprises a stack of a humidity barrier, a hole transport layer and an electron transport layer.

According to one embodiment, the bottom electrode of each photosensor comprises a top face, and a plurality of lateral faces, in contact with the film of semiconductor nanoparticles.

According to one embodiment, the bottom electrode of each photosensor comprises a stack of TiN and Ta layers.

According to one embodiment, the array of photosensors further comprises an anti-reflective stack arranged on top of the top electrodes of the photosensors.

According to one embodiment, each photosensor is topped by a microlens configured to focus light laterally towards a lateral center of the lateral extension of the corresponding photosensor and to focus light vertically towards a vertical center of a vertical extension of the film.

According to one embodiment, the transistor level is coupled to the bottom electrode of each photosensor by means of a corresponding metal pillar.

According to one embodiment, each of the pillars has a height over width ratio equal to or greater than 3.

According to one embodiment, the nanoparticles comprise lead sulfide.

According to one embodiment, the nanoparticles in the film have a mean diameter less than or equal to 15 nanometers and a diameter distribution with a standard deviation from the mean of 7% or less.

According to one embodiment, the nanoparticles in the film are surfaced by ligands configured to passivate and functionalize the surface of the nanoparticles.

According to one embodiment, at least some others of the photosensors comprise a third filter configured to transmit light in a range from 400 to 800 nanometers and to at least partially filter out, and prevent from reaching the photosensor, light with wavelengths lower than 400 nanometers and higher than 800 nanometers.

According to one embodiment, between 45 and 55 percent of the number of photosensors of the array of photosensors comprise the first filter, and the remaining photosensors of the array of photosensors comprise the second filter.

According to one embodiment, the device further comprises a light source configured to emit light having a wavelength in the range from 280 to 400 nanometers.

According to one embodiment, the light source is further configured to emit light having a wavelength in the range from 900 to 1500 nanometers, and/or the device comprises a further light source configured to emit light having a wavelength in the range from 900 to 1500 nanometers.

One embodiment provides a skin monitoring apparatus comprising a such imaging device.

One embodiment provides a water and/or gas monitoring apparatus comprising a such imaging device.

BRIEF DESCRIPTION OF DRAWINGS

The foregoing features and advantages, as well as others, will be described in detail in the following description of specific embodiments given by way of illustration and not limitation with reference to the accompanying drawings, in which.

DETAILED DESCRIPTION OF THE DRAWINGS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, or to an imaging device as orientated during normal use.

Unless specified otherwise, the expressions "around", "approximately", "substantially" and "in the order of" signify within 10%, and preferably within 5%.

Figure 1:
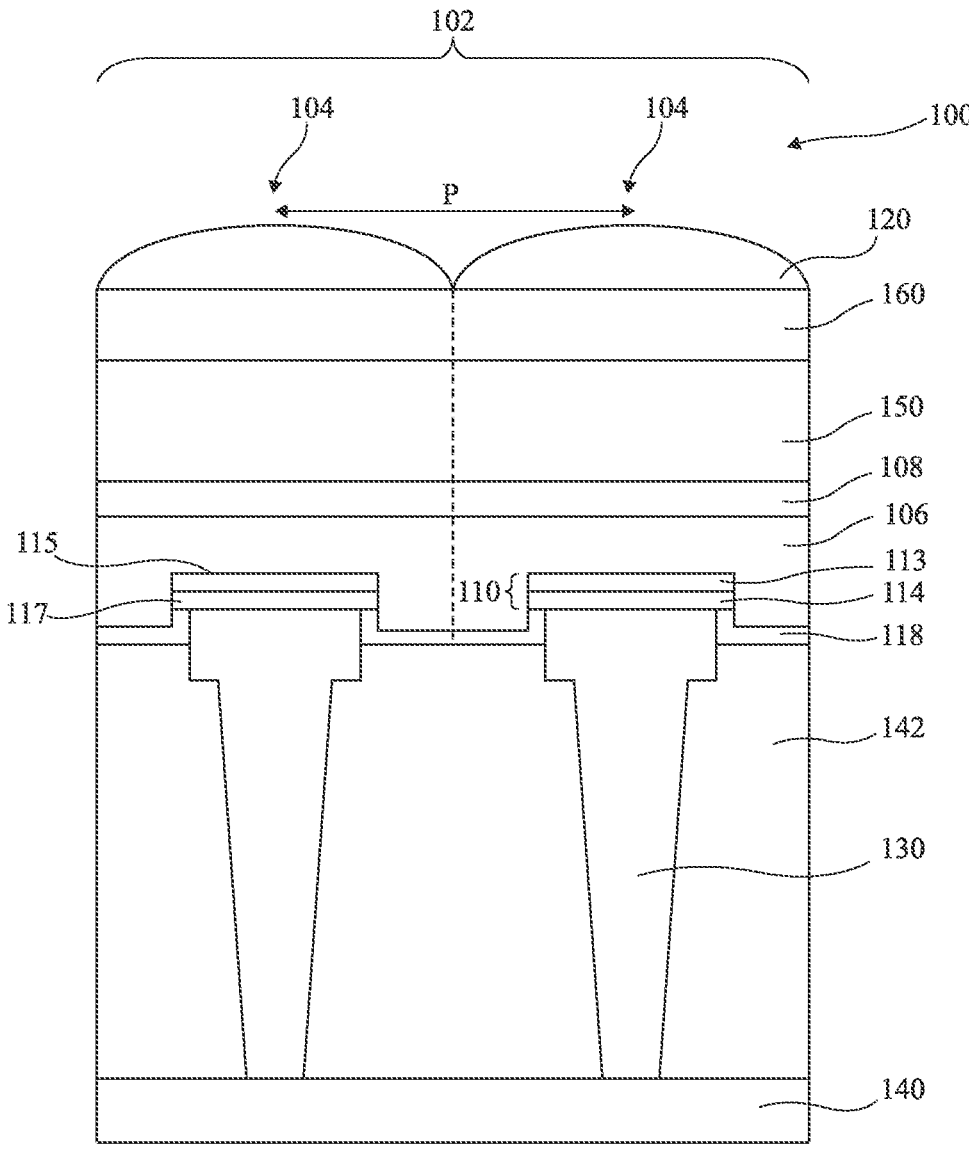
FIG. 1 is a schematic sectional view of an imaging device according to an example embodiment of the present disclosure.

FIG. 1 is a schematic sectional view of an imaging device 100 according to an example embodiment of the present disclosure.

The imaging device of the FIG. 1 comprises, for example, an array 102 of photosensors 104. The array comprises, for example, a film of semiconductor nanoparticles 106, which is common to the photosensors of the array. The film comprises, for example, nanoparticles configured to be excited by light with wavelengths in a range from 280 to 1500 nanometers. The nanoparticles comprise, for example, lead sulfide. The nanometer particle properties regarding wavelength absorption may be easily tuned by changing their diameter. In order to absorb UV light (i.e., wavelengths between 280 and 400 nanometers), the nanoparticles in the film have, for example, a mean diameter of less than or equal to 15 nanometers, for example of between 3 and 5 nanometers, and a diameter distribution with a standard deviation from the mean of 7% or less, for example 5%. The same particles may be used to absorb light in the ultraviolet spectrum (i.e., from 280 to 400 nanometers) and in the infrared spectrum (i.e., from 900 to 1500 nanometers).

In an example, the nanoparticles in the film 106 are surfaced by ligands configured to passivate and functionalize the surface of the nanoparticles. The ligands are, for example, chosen among the group consisting of organic aliphatics, organometallic or inorganic molecules to change the energy levels of the nanoparticles and therefore the light wavelengths that are absorbed by the nanoparticles.

In an example, the film 106 also comprises passivation elements made of halide.

In an example, the nanoparticle film 106 is obtained by repeating, for example up to 10 times, deposition cycles of a layer by layer deposition process, each deposition cycle for example comprising the deposition of a nanoparticle layer, the deposition of a ligand layer and the deposition of a halide compound layer, followed by a sintering step.

The photosensors 104 are arranged in the array 102 with a pitch P that is for example less than 3 micrometers, and for example of 2 micrometers or less, applied to either or both the column direction and the row direction. Such a pixel pitch can be achieved due to the use of the continuous film of semiconductor nanoparticles 106 that is common to the pixels of the array 102. Indeed, this film 106 forms the photosensitive layer of each pixel, and in contrast to photodiodes formed in bulk semiconductor technologies, it is not necessary to provide insulation between the photosensitive layers of adjacent pixels within the film 106.

Each photosensor 104 comprises, for example, a top electrode 108 and a bottom electrode 110 positioned on opposite sides of the film of semiconductor nanoparticles 106. As illustrated in the FIG. 1, the bottom electrode 110 of each photosensor, for example, comprises a top face 115, and a plurality of lateral faces 117, in contact with the film of semiconductor nanoparticles 106. The bottom electrodes 110 of the photosensors 104 comprise, for example, a stack of a TiN layer 113 and a Ta layer 114. These layers 113, 114 may serve as a barrier from diffusion of metal. The top electrodes 108 are, for example, formed by a layer that common to several photosensors 104, and in some embodiments common to all of the photosensors of the array. The top electrodes 108 are, for example, in contact with the film 106. The top electrodes comprise, for example, a stack of layers comprising a humidity barrier (formed for example of $Al_2O_3$), a hole transport layer (formed for example of $MoO_3$), and an electron transport layer (formed for example of indium transparent oxide (ITO)).

As illustrated in FIG. 1, the array 102 of photosensors comprises, for example, an anti-reflective stack 150 arranged on top of the top electrodes 108 of the photosensors 104. The anti-reflective stack 150 is, for example, composed of a stack of silicon nitride SiN layer(s) and silicon oxynitride SiON layer(s). In an example, the anti-reflective layer 150 is composed of a layer of SiN with a thickness of between 100 and 500 nanometers, topped by an SiON layer with a thickness between 100 and 500 nanometers, topped by another layer of SiN with a thickness of between 100 and 500 nanometers. The person of the art will understand how to change the thickness of these layers and/or of their respective optical indexes such that the anti-reflective layer 150 is relatively transparent to UV light.

As illustrated in the FIG. 1, the bottom electrodes 110 are, for example, coupled to a transistor level 140 of each photosensor 104 by means of a corresponding metal pillar 130 (or contact). The pillar material may be copper or aluminum for example. In an example, the pillars 130 have a height over width ratio equal to or greater than 3. This has the advantage of allowing a relatively large separation between the film 106 and the transistor layer 140, which for example allows the formation of connection pads (see FIG. 2 described below) adjacent to the array, while keeping the pixel pitch P relatively low. The pillars 130 may be embedded in an insulator 142 made of one or several layers of insulating material, for example, of silicon dioxide or silicon nitride or a low-k material. An insulating or passivation layer 118 made of an insulator is, for example, arranged between the insulator 142 and the film 106, and also for example contacts an upper part of the sides of the pillars 130 and a lower portion of the bottom electrode 110 in order to provide insulation between the sides of the pillars 130 and the film 106. The transistor level 140 is, for example, also coupled to the top electrodes 108 of the photosensors, this connection not being illustrated in FIG. 1.

Each photosensor 104 is, for example, topped by a microlens 120 configured to focus light towards a central portion of the photosensitive layer of the photosensor 104. For example, each microlens 120 is configured to focus light laterally towards the center of a lateral extension of the corresponding photosensor, and vertically towards the center of the vertical extension of the film 106. The microlenses 120 are, for example, arranged on the anti-reflective stack 150 or, as represented in the example of FIG. 1, on an optional encapsulation layer 160, which is, for example, arranged on the anti-reflective stack 150. The encapsulation layer 160 is, for example, of silicon nitride and is configured to prevent external humidity or oxygen from entering the photosensors. In an example, each microlens 120 is formed of a convex-planar lens having its convex surface orientated towards the image scene from which the light to be captured by the array 102 originates.

When light in the excitation range of the nanoparticles of the film 106, coming from the image scene outside of the imaging device, reaches these nanoparticles, for example via the microlenses 120, an exciton is created. Electrons and holes are then dissociated due to the shape of the nanoparticles and, for example, collected by the top and bottom electrodes 108, 130. The charges are transferred via the bottom electrodes 108 to the transistor level 140, where the signal generated by each pixel is captured and readout. In some embodiments, a global shutter operation is performed, according to which the signals from all of the pixels of the array are captured at the same time, and either readout immediately, or stored temporarily before being readout pixel by pixel or row by row. The read-out function of the transistor level 140 is, for example, similar to a standard read out function implemented in CMOS imaging technologies, using pixel circuits implemented in the transistor level 140. While not illustrated in the figures, the transistor level 140 for example comprises, for each photosensor 104, a charge storing element, for example a capacitive node, which temporally stores charges generated by the nanoparticle film 106 during an integration period of the imaging device. At the end of the integration period, a transfer element of each pixel circuit transfers, for example, the charges to a sense node of the pixel circuit, for example according to a global or rolling shutter operation. During a readout phase, the sense node voltage is, for example, read using a source follower transistor of the pixel circuit. Each pixel circuit also comprises, for example, a reset function for resetting the voltage between top and bottom electrodes before the start of each light integration period.

Although not illustrated in FIG. 1, at least some of the photosensors 104 comprise, for example, a first filter configured to transmit light with wavelengths in a range from 280 to 400 nanometers, and to at least partially filter out, and at least partially prevent from reaching the photosensor, light with wavelengths greater than 400 nanometers. By the term "filter out", it should be understood that more than half of the incoming light is, for example, absorbed or reflected by the filter.

In one example, all of the photosensors 104 comprise the first filter, and in this case, the filter is formed, for example, formed by a layer extending across the array 102 that is common to all of the photosensors 104.

In another example, only some of the photosensors 104 of the array 102 comprise the first filter, and at least some of the photosensors 104 comprise a second filter (also not illustrated in FIG. 1) configured to transmit light in a range from 900 to 1500 nanometers and to at least partially filter out, and at least partially prevent from reaching the photosensor, light with wavelengths lower than 900 nanometers. For example, the photosensors 104 of the array 102 are arranged in columns and rows, and the photosensors comprising the first filter are arranged in a checkerboard pattern, with the remaining photosensors 104 of the array comprising the second filter.

In an example, the array of photosensors may be arranged in pixels each comprising a plurality of photosensors 104, among which at least one comprises the first filter, and at least one comprises the second filter.

The first or second filter may be arranged as a layer covering on top of the microlenses 120 if they are present, or as a layer between the microlenses 120 and the encapsulation layer 160 if it is present.

The first and/or the second filters may comprise organic particles embedded in a polymer matrix. Alternatively, the first and/or second filters comprise a Bragg structure, or are implemented by an interference filter.

Figure 2:
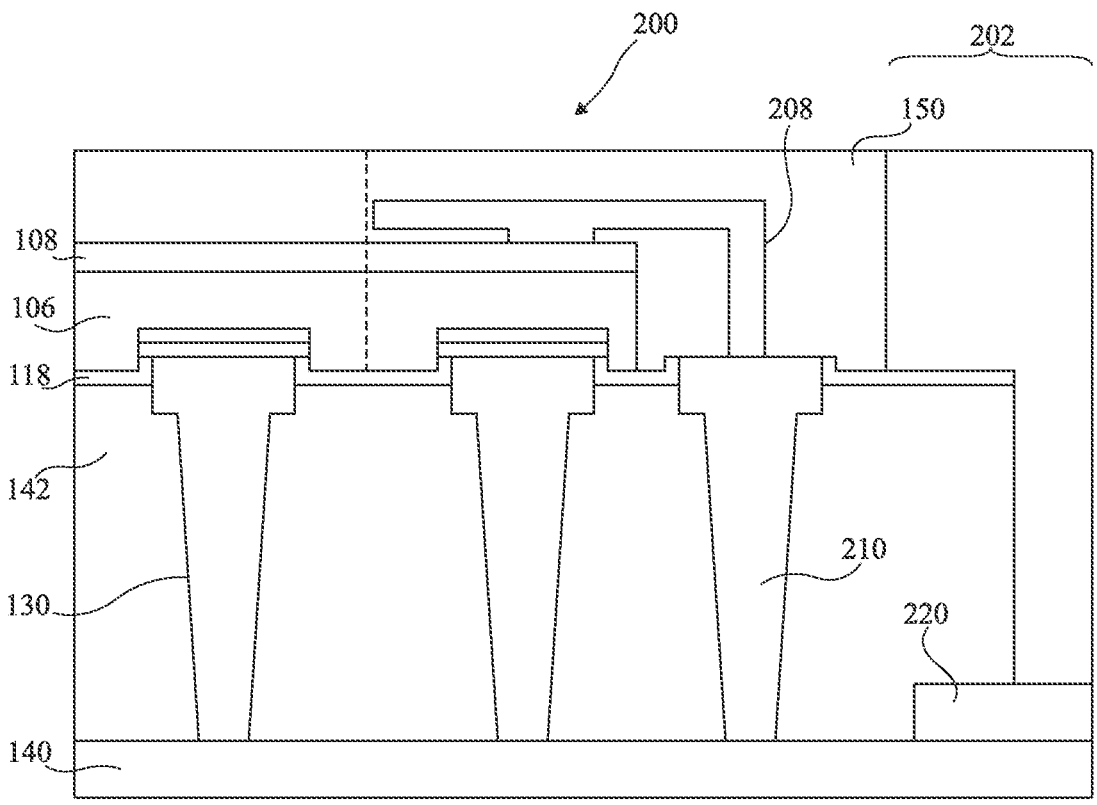
FIG. 2 is a schematic sectional view of an electronic device according to another example embodiment of the present disclosure.

FIG. 2 is a schematic sectional view of an imaging device 200 according to another example embodiment of the present disclosure.

In the example of FIG. 2, the imaging device 200 comprises several elements similar to those of the imaging device 100 of FIG. 1, including the insulating layer 118, the bottom electrodes, the metal pillars 130, the insulating layer 142, and the transistor level 140.

In the example of FIG. 2, the top electrode 108 and the nanoparticles film 106 are, for example, missing on at least one portion 202 of the imaging device 200 in such a way that the film 106 and the covering top electrode 108 are interrupted at the beginning of the portion 202. The portion 202 is, for example, located above one or more additional pillars 210 similar to the pillars 130. The anti-reflection layer 150 is, for example, arranged in the portion 202 between a region of an upper surface of the additional pillar 210 and a lateral surface of the film 106 and the covering top electrode 108 where they are interrupted. The anti-reflection layer 150 also, for example, covers the insulating layer 118, which is in contact with the additional pillar 210.

In the example of FIG. 2, the top electrode 108 is, for example, coupled to a conductive track 208. The conductive track 208 is, for example, coupled to the additional pillar 210 through the anti-reflective layer 150. The additional pillar 210 is, for example, coupled to the transistor level 140. In the example of FIG. 2, the anti-reflective layer 150, for example, covers a space between an upper surface of the top electrode 108 and a lower surface of the conductive track 208.

In the example of FIG. 2, a metal pad 220 is, for example, arranged in contact with the transistor level 140 for external contacting purpose.

Figure 3:
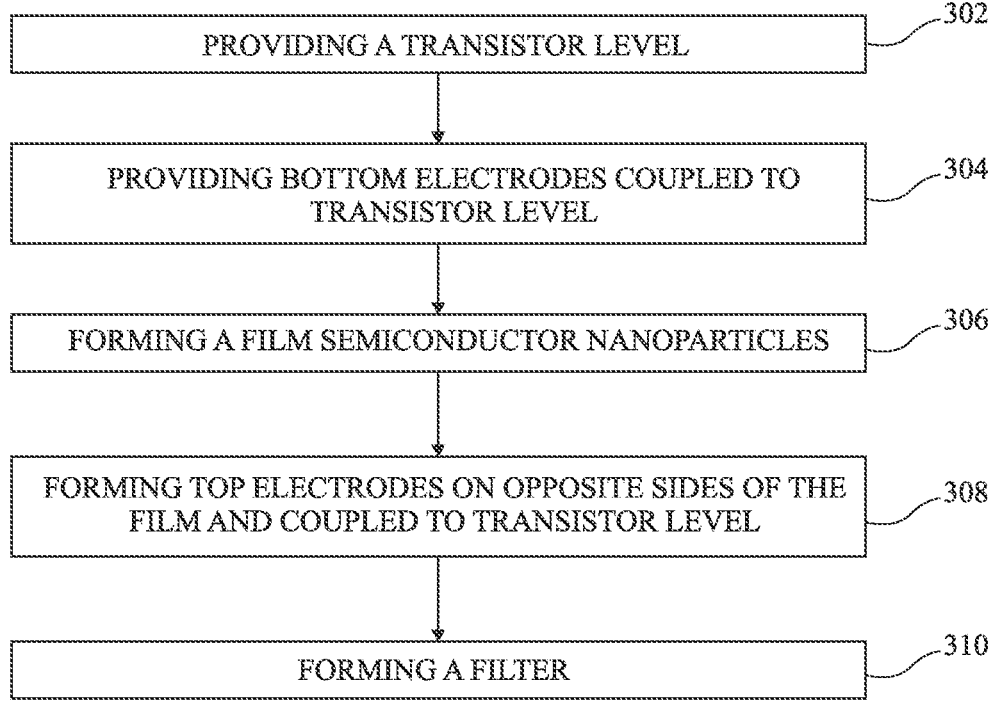
FIG. 3 is a flow diagram illustrating steps of a manufacturing method of the imaging device of FIGS. 1 and 2.

FIG. 3 illustrates steps of a manufacturing method of the imaging device of FIGS. 1 and 2.

In a first step 302 (PROVIDING A TRANSISTOR LEVEL), the transistor level 140 is provided, for example, using known CMOS technologies. This step may include, for example, formation of the layer 142, contacts 130 and passivation 118.

In a step 304 (PROVIDING BOTTOM ELECTRODES COUPLED TO TRANSISTOR LEVEL), the bottom electrodes 110 of photosensors 104 of the array are provided using, for example, known interconnect technologies.

In a step 306 (FORMING A FILM OF SEMICONDUCTOR NANOPARTICLES), the film of semiconductor nanoparticles 106, is formed, for example using a layer by layer process as described above or for example a one-step layer deposition, onto the top surface obtained in the step 304 in such way that the film 106 is common to the photosensors 104 of the array.

In a step 308 (FORMING TOP ELECTRODES ON OPPOSITE SIDES OF THE FILM AND COUPLED TO TRANSISTOR LEVEL), the top electrodes 108 of the photosensors are formed, for example, in such a way that bottom and top electrodes are positioned on opposite side of the film of semiconductor nanoparticles 106. This step may further include, for example, the formation of electrical connection between the transistor level 140 and top electrodes 108 of the photosensors 104.

In a step 310 (FORMING A FILTER), the first filter and/or the second filter are formed. The first and/or second filter are provided, for example, as part of additional mechanical pieces over the microlenses or over the anti-reflection layers.

This method advantageously allows the fabrication of an imaging device having a pitch P that is compatible with high resolution UV imaging.

Figure 4:
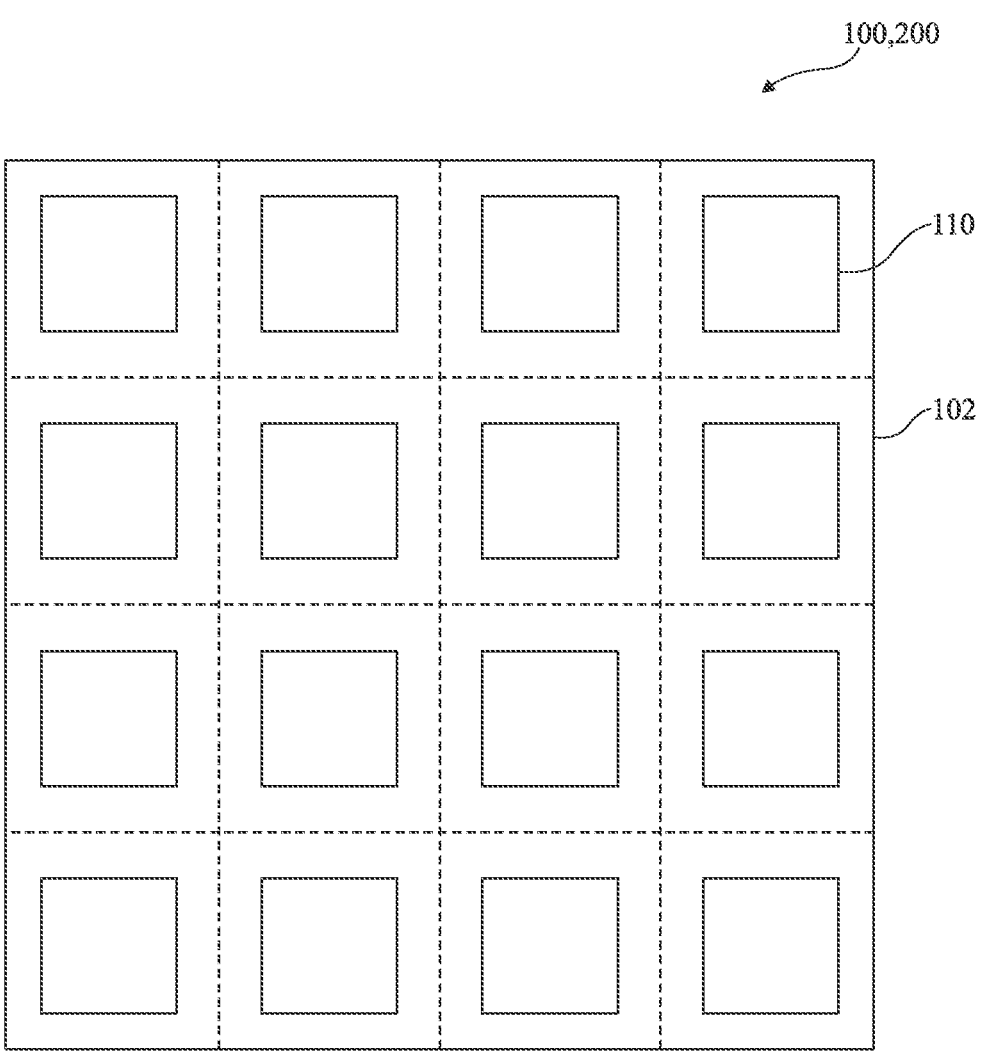
FIG. 4 illustrates a schematic top view of the imaging device of FIGS. 1 and 2.

FIG. 4 illustrates a schematic top view of the imaging device 100, 200 of FIGS. 1 and 2.

In the example of FIG. 4, photosensors are arranged according to a 4 by 4 array. In another example, there could be a different number of rows and columns in the array 102, such as, for example, thousands or tens of thousands of columns and rows. A detection area associated by each photosensor is represented schematically by dashed lines in FIG. 4. In the view represented in FIG. 4, only the bottom electrodes of the photosensors are illustrated, and they exhibit, for example, a square shape or a rectangular shape. In alternative embodiments, other shapes would be possible. Each bottom electrode 110 has, for example, a surface area in the plan view of FIG. 4 that is between 30% and 60% of the surface area of the detection area of the photosensor. Such an embodiment provides a quantum efficiency above 50% and a modulation transform function (MTF) at Nyquist/2 of over 0.75 for a 2.2 μm pitch global shutter imaging device.

Figure 5:
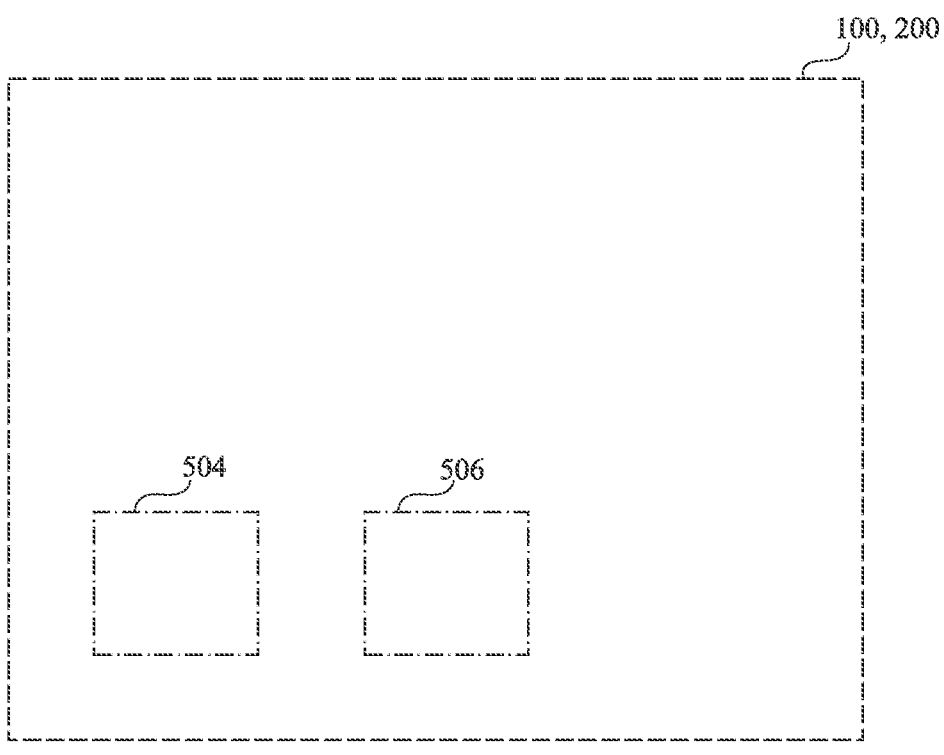
FIG. 5 is a schematic view of the electronic device of the examples of FIGS. 1 and 2 according to another example embodiment of the present disclosure.

FIG. 5 is a schematic view of the imaging device 100 or 200 of FIGS. 1 and 2 according to another example embodiment of the present disclosure.

In the example of FIG. 5, the imaging device 100, 200 comprises, for example, a light source 504 configured to emit light having a wavelength in the range from 280 to 400 nanometers. The light source 504 is configured, for example, during an integration period of the imaging device 100 or 200, to generate light rays towards an external scene to be captured. The light rays generated by the light source 504 are scattered and/or reflected by the scene. The imaging device 100 or 200 is, for example, configured to switch off the light source 504 at the end of the integration phase and to enter a readout phase during which the corresponding generated charges are transferred to pixel circuits and processed.

In an example in which the array 102 comprises at least some photosensors configured to capture IR light, the light source 504 is, for example, further configured to emit light having a wavelength in the range from 900 to 1500 nanometers during a corresponding integration period.

In the example of FIG. 5, the imaging device 100 or 200 comprises, for example, a further light source 506 configured to emit light having a wavelength in the range from 900 to 1500 nanometers. In an example, the further light source 506 functions in a similar manner as the light source 504. In another example, the two light sources 504 and 506 are switched on sequentially in order to illuminate a scene with different illuminating wavelengths. In this case, for example, only charges generated in the photosensors which are topped by the filter allowing the same wavelength as the illuminating light source, may be processed. It allows to obtain images of a same scene illuminated by different wavelengths. By comparing the images captured with different illuminating wavelength, it is possible to deduce information, about the illuminated scene, that would not be accessible with only one illuminating light source. Moreover, UV imaging gives different details of an object compared to what a visible or infrared light would give.

The imaging device 100 or 200 may have various applications in which relatively high-resolution UV imaging is used. According to one example, the imaging device 100 or 200 is part of a skin monitoring apparatus configured to performing UV imaging of skin, such as the face of a user, in order to check skin health, and/or for detecting the presence of products on the skin, such as makeup or sunscreen. According to another example, the imaging device is part of a water and/or gas monitoring apparatus, which is configured, for example, to measure pollutant compounds, such as phosphate, hydrogen sulphide and/or hydrocarbons in water, or pollutants such as ammonia, hydrogen sulphide, nitric oxide, sulphur dioxide, nitrogen dioxide and/or mercaptans in air.

Various embodiments and variants have been described. Those skilled in the art will understand that certain features of these embodiments can be combined and other variants will readily occur to those skilled in the art. For example, while embodiments have been described in which the imaging device comprises a CMOS readout circuit, other types of readout circuit could be used. Furthermore, it will be apparent to those skilled in the art that, rather than being integrated in the photosensors, the filters described herein could be integrated into an optical module positioned above the array 102, the filters for example being implemented as a coating on one or more lenses or planar windows covering the array.

Embodiments of the imaging devices 100, 200 have been described in which the photosensors 104 all have the first filter, or some have the first filter, and others have the second filter. For example, the array of photosensors is composed with substantially half, or between 45% and 55%, of the number of photosensors comprising the first filter, and the remaining photosensors comprising the second filter.

In alternative embodiments of the imaging devices 100, 200, in addition to the photosensors 104 having the first and/or second filters, at least some of the photosensors 104 comprise a third filter configured to transmit light in the range from 400 to 800 nanometers and to at least partially filter out, and prevent from reaching the photosensor 104, light with wavelengths lower than 400 nanometers and higher than 800 nanometers.

In further alternative embodiments of the imaging devices 100, 200, the array of photosensors is composed with substantially one third or between 30% and 35%, of the photosensors 104 comprising the first filter, substantially one third, or between 30% and 35% of the photosensors 104 comprising the second filter and substantially one third, or between 30% and 35% of the photosensors 104 comprising the third filter.

Finally, the practical implementation of the embodiments and variants described herein is within the capabilities of those skilled in the art based on the functional description provided hereinabove.

The invention claimed is:

1. An imaging device, comprising:
an array of photosensors;
wherein the array comprises a film of semiconductor nanoparticles common to the photosensors of the array, the semiconductor nanoparticles configured to be excited by light with wavelengths in a range from 280 to 1500 nanometers;
wherein each photosensor comprises a top electrode and a bottom electrode positioned on opposite sides of the film of semiconductor nanoparticles;
wherein first ones of the photosensors in said array comprise a first filter that is configured to transmit ultraviolet light with wavelengths across a range from 280 to 400 nanometers to the photosensor and at least partially filter out light with wavelengths greater than 400 nanometers from reaching the photosensor; and
a transistor level coupled to the top and bottom electrodes of the photosensors.

2. The device according to claim 1, wherein the photosensors in the array are arranged in columns and rows with a pitch of 2 micrometers or less in a direction of the columns and/or in a direction of the rows.

3. The device according to claim 1, wherein second ones of the photosensors of said array comprise a second filter that is configured to transmit infrared light across a range from 900 to 1500 nanometers to the photosensor and at least partially filter out light with wavelengths lower than 900 nanometers from reaching the photosensor.

4. The device according to claim 3, wherein third ones of the photosensors of said array comprise a third filter that is configured to transmit visible light across a range from 400 to 800 nanometers to the photosensor and at least partially filter out ultraviolet light with wavelengths lower than 400 nanometers and infrared light with wavelengths higher than 800 nanometers from reaching the photosensor.

5. The device according to claim 4, wherein between 30 and 35 percent of a number of photosensors of the array comprise first ones of the photosensors with said first filter, between 30 and 35 percent of the number of photosensors of the array comprise second ones of the photosensors with said second filter and between 30 and 35 percent of the number of photosensors of the array comprise third ones of the photosensors with said third filter.

6. The device according to claim 3, wherein between 45 and 55 percent of a number of photosensors of the array comprise first ones of the photosensors with said first filter, and remaining photosensors of the array comprise second ones of the photosensors with said second filter.

7. The device according to claim 1, further comprising an ultraviolet light source configured to emit light having a wavelength in the range from 280 to 400 nanometers.

8. The device according to claim 3, further comprising an infrared light source configured to emit light having a wavelength in the range from 900 to 1500 nanometers.

9. The device according to claim 1, wherein the top electrode of each photosensor comprises a stack of a humidity barrier layer, a hole transport layer and an electron transport layer.

10. The device according to claim 1, wherein the bottom electrode of each photosensor comprises a top face and a plurality of lateral faces, and wherein the film of semiconductor nanoparticles is in contact with the top face and lateral faces of the bottom electrode.

11. The device according to claim 1, wherein the bottom electrode of each photosensor comprises a stack of a TiN layer and a Ta layer.

12. The device according to claim 1, wherein the array of photosensors further comprises an anti-reflective stack arranged on top of the top electrode of each photosensor.

13. The device according to claim 1, further comprising a microlens over each photosensor, wherein said microlens is configured to focus light towards a lateral center of a lateral extension of the photosensor and to focus light towards a vertical center of a vertical extension of the film of semiconductor nanoparticles.

14. The device according to claim 1, further comprising a metal pillar electrically connecting the transistor level to the bottom electrode of each photosensor.

15. The device according to claim 1, wherein the metal pillar has a height over width ratio equal to or greater than 3.

16. The device according to claim 1, wherein the semiconductor nanoparticles comprise lead sulfide.

17. The device according to claim 1, wherein the semiconductor nanoparticles have a mean diameter less than or equal to 15 nanometers and a diameter distribution with a standard deviation from the mean diameter of 7% or less.

18. The device according to claim 1, wherein the semiconductor nanoparticles are surfaced by ligands configured to passivate and functionalize a surface of the semiconductor nanoparticles.

19. A skin monitoring apparatus comprising the imaging device of claim 1.

20. A water and/or gas monitoring apparatus comprising the imaging device of claim 1.

* * * * *